(12) United States Patent    (10) Patent No.:     US 8,766,241 B2
     Yamazaki et al.          (45) Date of Patent:     Jul. 1, 2014

(54) ORGANIC LIGHT-EMITTING DEVICE

(75) Inventors: Takuro Yamazaki, Chiba (JP); Kohei Nagayama, Chiba (JP)

(73) Assignee: Canon Kabushiki Kaisha, Tokyo (JP)

(*) Notice: Subject to any disclaimer, the term of this patent is extended or adjusted under 35 U.S.C. 154(b) by 681 days.

(21) Appl. No.: 12/996,732

(22) PCT Filed: Jun. 4, 2009

(86) PCT No.: PCT/JP2009/002520
§ 371 (c)(1),
(2), (4) Date: Mar. 22, 2011

(87) PCT Pub. No.: WO2009/150802
PCT Pub. Date: Dec. 17, 2009

(65) Prior Publication Data
US 2011/0163331 A1   Jul. 7, 2011

(30) Foreign Application Priority Data
Jun. 9, 2008   (JP) ................................. 2008-150489

(51) Int. Cl.
*H01L 51/50*   (2006.01)

(52) U.S. Cl.
CPC ................................. *H01L 51/5048* (2013.01)
USPC .......... 257/40; 257/88; 257/E51.018; 438/23; 438/99

(58) Field of Classification Search
CPC ........................... H01L 51/50; H01L 51/5048
USPC ................... 257/40, 88, E51.018; 438/23, 99
See application file for complete search history.

(56) References Cited

U.S. PATENT DOCUMENTS

| 6,306,694 | B1 * | 10/2001 | Yamazaki et al. | ............. 438/151 |
| 6,524,877 | B1 * | 2/2003 | Nakazawa et al. | ............. 438/48 |
| 6,531,713 | B1 * | 3/2003 | Yamazaki | ............. 257/59 |
| 7,122,835 | B1 * | 10/2006 | Ikeda et al. | ............. 257/72 |
| 7,855,380 | B2 * | 12/2010 | Yamazaki et al. | ............. 257/59 |
| 2005/0023964 | A1 | 2/2005 | Omura et al. | |
| 2005/0218396 | A1 | 10/2005 | Tsuchiya | |
| 2006/0033429 | A1 | 2/2006 | Fujimura | |
| 2006/0249733 | A1 * | 11/2006 | Yamazaki et al. | ............. 257/72 |
| 2006/0258043 | A1 * | 11/2006 | Bold et al. | ............. 438/99 |
| 2007/0228380 | A1 | 10/2007 | Yoshinaga | |
| 2009/0101904 | A1 | 4/2009 | Yamamoto | |

FOREIGN PATENT DOCUMENTS

| CN | 1671255 A | 9/2005 |
| JP | 2005-164818 A | 6/2005 |
| JP | 2005-302707 A | 10/2005 |
| JP | 2006-054111 A | 2/2006 |
| JP | 2007-294405 A | 11/2007 |

* cited by examiner

*Primary Examiner* — Allan R Wilson
(74) *Attorney, Agent, or Firm* — Canon U.S.A., Inc., IP Division

(57) ABSTRACT

The present invention relates to an organic light-emitting device capable of suppressing deterioration of organic EL elements at the corners of an emission region.

The organic light-emitting device includes a planarization film which planarizes thin film transistors arranged in an emission region where pixels are arranged, an element separation film which defines the pixels formed on the planarization film, a charge transport layer formed on the planarization film in each pixel. The charge transport layer contains any one of alkali metals and alkaline-earth metals and extends to outside of the emission region so as to cover the side surface of a peripheral portion of the planarization film, which is disposed in a peripheral region, the planarization film being formed in the emission region.

6 Claims, 6 Drawing Sheets

ORGANIC LIGHT-EMITTING DEVICE

TECHNICAL FIELD

The present invention relates to an organic light-emitting device used for flat element displays and the like.

BACKGROUND ART

Organic light-emitting devices attract much attention as self-emitting devices which are expected to be decreased in thickness and power consumption.

A display including an active matrix-type organic light-emitting device provided in a display portion and including a thin film transistor provided as a switching element in each pixel can realize high-definition, high-quality display and is thus used in a variety of fields. A drive circuit which controls the thin film transistor corresponding to each pixel is provided in a peripheral region around an emission region in which pixels are disposed, and, besides the drive circuit, wirings such as power supply wiring, signal wiring, and the like are formed in the peripheral region. A thin film transistor connected to each pixel and a drive circuit provided in the peripheral region are important factors which determine display quality.

An organic EL element which constitutes an organic light-emitting device includes a first electrode, a second electrode, and a plurality of organic compound layers having different functions, such as a hole transport layer, a light-emitting layer, an electron transport layer, an electron injection layer, which are laminated between both electrodes.

The organic EL element holds a problem that entering of moisture and gases into the element causes a decrease in luminance and an increase in drive voltage. In an organic light-emitting device, therefore, in order to prevent atmospheric moisture and gases from entering the organic compound layers of the organic El element, a sealing layer is disposed on the side of a substrate on which the organic EL element is provided, and the peripheries of the substrate and the sealing layer are sealed with a sealant.

Even if entering of atmospheric moisture and gases can be interrupted by the sealing layer and the sealant, when constituents which constitute an organic light-emitting device contain moisture and gases, diffusion of moisture and gases in the organic light-emitting device proceeds to degrade organic EL elements, thereby decreasing luminance.

In particular, in an active matrix-type organic light-emitting device, a planarization film including an organic photosensitive insulating film is provided to cover thin-film transistors and drive circuits. The planarization film is provided for planarization by decreasing steps produced by forming thin-film transistors and drive circuits, and organic EL elements are formed on the planarization film. Further, in some organic light-emitting devices, in order to separate elements from each other, an element separation film including an organic insulting film is formed on a planarization film. A resin film such as the organic insulating film which constitutes the planarization film or the element separation film is easily permeable to moisture and gases and easily adsorbs moisture and gases therein. Therefore, in such a type of organic light-emitting device, moisture and gases easily remain in the device, and the remaining moisture and gases diffuse in the resin layer and enter organic compound layers of organic EL elements, thereby causing deterioration of light emission.

In a display device disclosed in Japanese Patent Laid-Open No. 2006-054111, in order to solve the problem, a planarization film and an element separation film each composed of a resin are removed from a portion surrounding an emission region to form a separation groove which separates an inner peripheral portion from an outer peripheral portion. Therefore, moisture present in a portion of the planarization film and the element separation film, which corresponds to the outer peripheral portion, does not enter a portion of the planarization film and the element separation film, which corresponds to the inner peripheral portion, through the planarization film and the element separation film, thereby preventing deterioration of organic EL elements due to moisture in a display region.

In the configuration of Japanese Patent Laid-Open No. 2006-054111, the moisture and gases present in the planarization film and the element separation film corresponding to a periphery of the emission region can be suppressed from entering the planarization film and the element separation film within the emission region through the planarization film and the element separation film. However, the organic EL elements deteriorate due to the influence of the moisture and gases remaining the planarization film and the element separation film within the emission region, thereby causing difficulty in achieving long-term reliability required for an organic EL light-emitting device.

As a result of keen examination, the inventors of the present invention found that moisture and gases remaining in the planarization film and the element separation film disposed in a periphery of the emission region diffuse into a space (sealing space) between a substrate and a sealing layer, enter the planarization film and the element separation film within the emission region, and diffuse to organic compound layers in each pixel. Further, when sufficient sealing cannot be achieved due to damage to a sealant, atmospheric moisture and gases enter the space between the substrate and the sealing layer from the outside, are absorbed by the planarization film and the element separation film, and diffuse into organic EL elements, thereby causing deterioration of the organic EL elements.

DISCLOSURE OF INVENTION

The present invention provides a light-emitting device with excellent long-term reliability in which entering of moisture and gases remaining in a planarization film and an element separation film within an emission region into organic EL elements is decreased, and entering of moisture and gases from outside of the emission region is also decreased.

An organic light-emitting device of the present invention has a substrate having an emission region in which pixels are arranged and a peripheral region which surrounds the emission region, thin film transistors arranged in the emission region of the substrate, a planarization film composed of a resin which planarizes the thin film transistors, an element separation film which defines pixels formed on the planarization film, and an organic EL element including at least a first electrode, a light-emitting layer, a charge transport layer comprising any one of alkali metals and alkaline-earth metals, and a second electrode, which are disposed on the planarization film within each of the pixels, wherein the charge transport layer extends to outside of the emission region so as to cover the side surface of a peripheral portion of the planarization film, which is disposed in the peripheral region, the planarization film being formed in the emission region.

DESCRIPTION OF EMBODIMENT

Embodiments of the present invention are described below with reference to FIGS. 1 to 6. Each of these figures schematically shows a portion of an example of the configuration of an organic light-emitting device according to the present invention.

Figure 1:
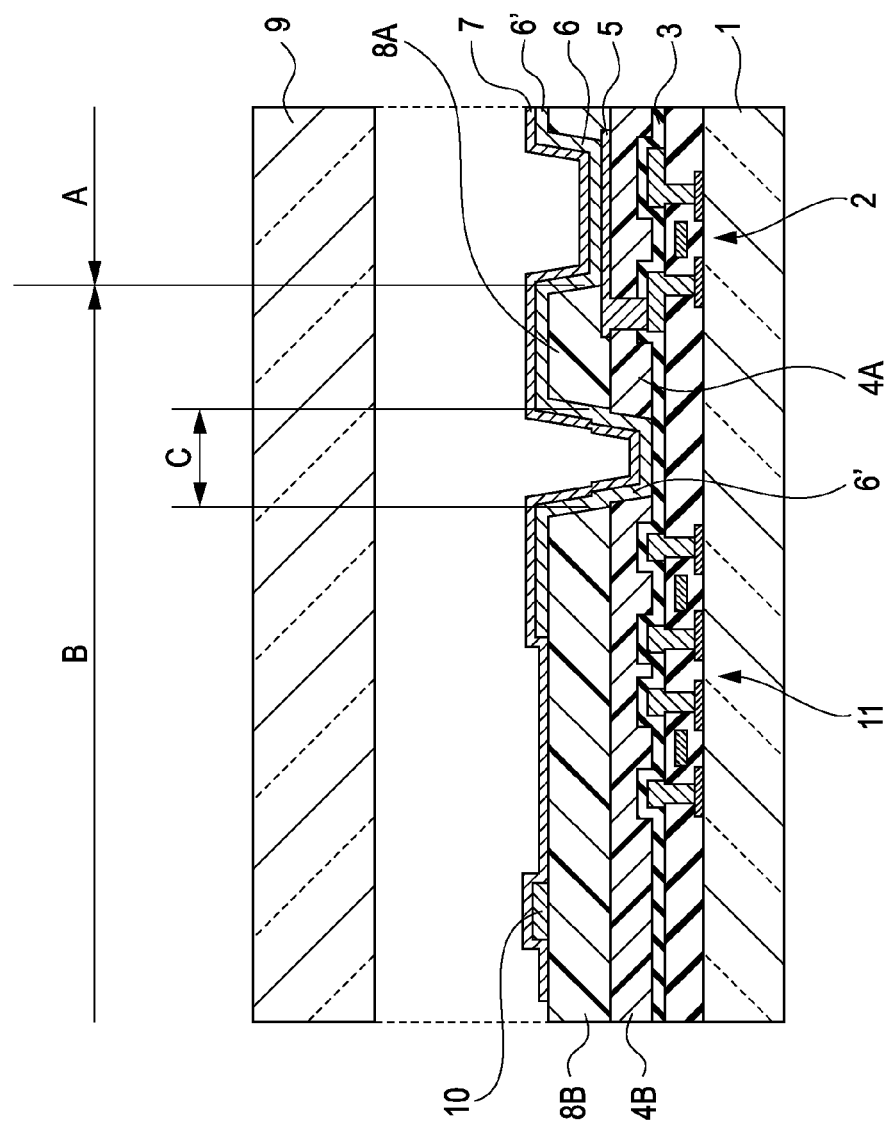
FIG. 1 is a sectional view schematically showing an example of an organic light-emitting device according to an embodiment of the present invention.
Figure 2:
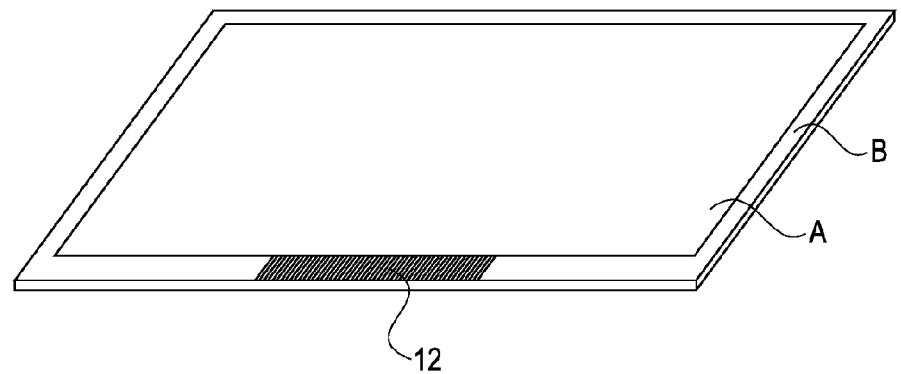
FIG. 2 is a perspective view schematically showing an example of an organic light-emitting device according to an embodiment of the present invention.

FIG. 1 is a schematic sectional view of an end portion of an organic light-emitting device according to the present invention. FIG. 2 is a perspective view of an organic light-emitting device according to the present invention. FIG. 1 is a sectional view of a boundary portion between an emission region A and a peripheral region B serving as a non-emission region disposed around the emission region A shown in FIG. 2. The emission region is a region in which a plurality of defined pixels are arranged, the region including a plurality of pixels and regions sandwiched between the pixels. Each of the pixels is a portion including a light-emitting layer held between electrodes.

In the emission region A of the organic light-emitting device shown in FIG. 1, a thin film transistor (TFT) 2, an inorganic insulating film 3, and a planarization film 4A are laminated in that order on a substrate 1, a first electrode 5 of a unit pixel is formed on the planarization film 4A. The periphery of each pixel is covered with an element separation film 8A. The substrate 1 is composed of an inorganic material such as glass, Si, or the like. The planarization film 4A planarizes the TFT 2, and the element separation film 8A defines the pixels, both films being composed of resins. As the resins, acrylic resin, polyimide resin, or the like can be used. The first electrode 5 is connected to the TFT 2 through a contact hole formed in the inorganic insulating film 3 and the planarization film 4A. An organic compound layer 6 is formed on the first electrode 5 formed in each pixel on the substrate 1. The organic compound layer 6 has a light-emitting layer and a charge transport layer 6'. The charge transport layer 6' may include one of a hole injection layer, a hole transport layer, an electron transport layer, and an electron injection layer or may include a plurality of layers of these layer. Further, a second electrode 7 is formed over the organic compound layer 6. Further, a sealing glass 9 is disposed to over the whole of the emission region A, and the periphery of the sealing glass 9 is bonded to the substrate 1 with an adhesive (not shown).

In the peripheral region B, a drive circuit 1 which controls drive of the TFT 2 is provided, and a planarization film 4B and an element separation film 8B are formed on the drive circuit 11. The planarization film 4B and the element separation film 8B are formed integrally with the planarization film 4A and the element separation film 8A, respectively, and then partially removed from a portion around the emission region A to provide a dividing region C. That is, the planarization film and the element separation film which have high contents of moisture and gases are divided between the emission region A and the peripheral region B. Therefore, moisture and gases remaining in the planarization film 4B and the element separation film 8B in the peripheral region B are prevented from moving in a direction parallel to the substrate through the planarization film and the element separation film and being transferred to the planarization film 4A and the element separation film 8A in the emission region A, thereby decreasing deterioration of organic EL elements. In this case, the element separation film 8B is formed integrally with the element separation film 8A and then separated from the element separation film 8A. Therefore, the element separation film 8B has no function to define pixels and may be interpreted as a part of the planarization film 4B. However, for convenience sake, the term "the element separation film 8B" is used. The planarization film 4A and the planarization film 4B may be formed independently so as to be separated by the dividing region C at the time of formation. Similarly, the element separation film 8A and the element separation film 8B may be formed independently on the planarization film 4A and the planarization film 4B, respectively. Further, neither the planarization film 4B nor the element separation film 8B may be formed, or only one of both films may be formed.

Further, in the configuration shown in FIG. 1, the charge transport layer 6' in each pixel is provided to extend to the outside of the emission region A so as to cover the side surface of a peripheral portion of the planarization film 4A, which is disposed in the peripheral region B, the planarization film 4A being formed in the emission region A. The charge transport layer 6' may be formed to cover a portion or a side of the periphery of the planarization film 4A but formed to cover the whole periphery.

The charge transport layer 6' includes one of a hole injection layer, a hole transport layer, an electron transport layer, and an electron injection layer or combination of these layers. The charge transport layer 6' contains any one of alkali metals and alkaline-earth metals. Specifically, a layer containing at least one of alkali metals and alkaline-earth metals is an electron injection layer, and the charge transport layer 6' includes at least the electron injection layer.

The alkali metals include Li, Na, K, Rb, Cs, and Fr, and the alkaline-earth metals include Be, Mg, Ca, Sr, Ba, and Ra. The alkali metals and the alkaline-earth metals have high ionization tendency and thus have high reactivity with moisture and gases. Therefore, the alkali metals and the alkaline-earth metals chemically bond with moisture and gases to function as an adsorbent. Hence, moisture and gases remaining in the planarization film 4A and the element separation film 8A are adsorbed by the charge transport layer 6' which covers the side surfaces of the peripheral portions of the planarization film 4A and the element separation film 8A, which are disposed in the peripheral region B. That is, a portion of the charge transport layer 6' which is disposed outside a pixel and the emission region A functions as an adsorbent for moisture and gases.

Further, in the space (sealing space) between the glass substrate 1 and the sealing glass 9, the planarization film 4A and the element separation film 8A are not exposed, and thus if moisture and gases are present in the sealing space, entering of moisture and gases into the planarization film 4A and the element separation film 8A can be decreased.

In addition, the charge transport layer 6' is formed to cover not only the element separation film 8A but also the planarization film 4A. Therefore, moisture and gases remaining in the planarization film 4A and the element separation film 8A diffuse therein and are efficiently adsorbed by the charge transport layer 6'.

Next, the configuration of the present invention is described in further detail.

The present invention has the configuration in which the charge transport layer 6' containing any one of alkali metals and alkaline-earth metals is provided to extend to the outside of the emission region A so as to cover the side surfaces of peripheral portions of the planarization film 4A and the element separation film 8A, which are disposed in the peripheral region B, the planarization film 4A and the element separation film 8A being formed in the emission region A.

In the configuration of the present invention, alkali metals and alkaline-earth metals are not limited as long as they have adsorptivity for moisture and gases. However, from the viewpoint of electron transport ability and adsorptivity for moisture and gases, Li, Na, Cs, Mg, Ca, Sr, and compounds thereof can be used.

In the embodiment shown in FIG. 1, the charge transport layer 6' is formed to extent across the dividing region C and cover the side surfaces of portions of the planarization film 4B and the element separation film 8B, which are disposed in the dividing region C, the planarization film 4B and the element separation film 8B being formed in the peripheral region B. In this case, moisture and gases remaining in the planarization film 4B and the element separation film 8B are adsorbed by the charge transport layer 6', thereby decreasing the amount of moisture and gases released from the planarization film 4B and the element separation film 8B to the sealing space. Further, in order to improve the adsorption of moisture and gases remaining in the planarization film 4B and the element separation film 8B, the area of the planarization film 4B and the element separation film 8B covered with the charge transport layer 6' may be increased. However, in FIG. 1, electrode wiring 10 is formed over the planarization film 4B and the element separation film 8B, for supplying a potential to a second electrode. Therefore, in order to electrically connect the second electrode and the electrode wiring, the charge transport layer 6' is formed so as not to be disposed on the electrode wiring 10.

Figure 3:
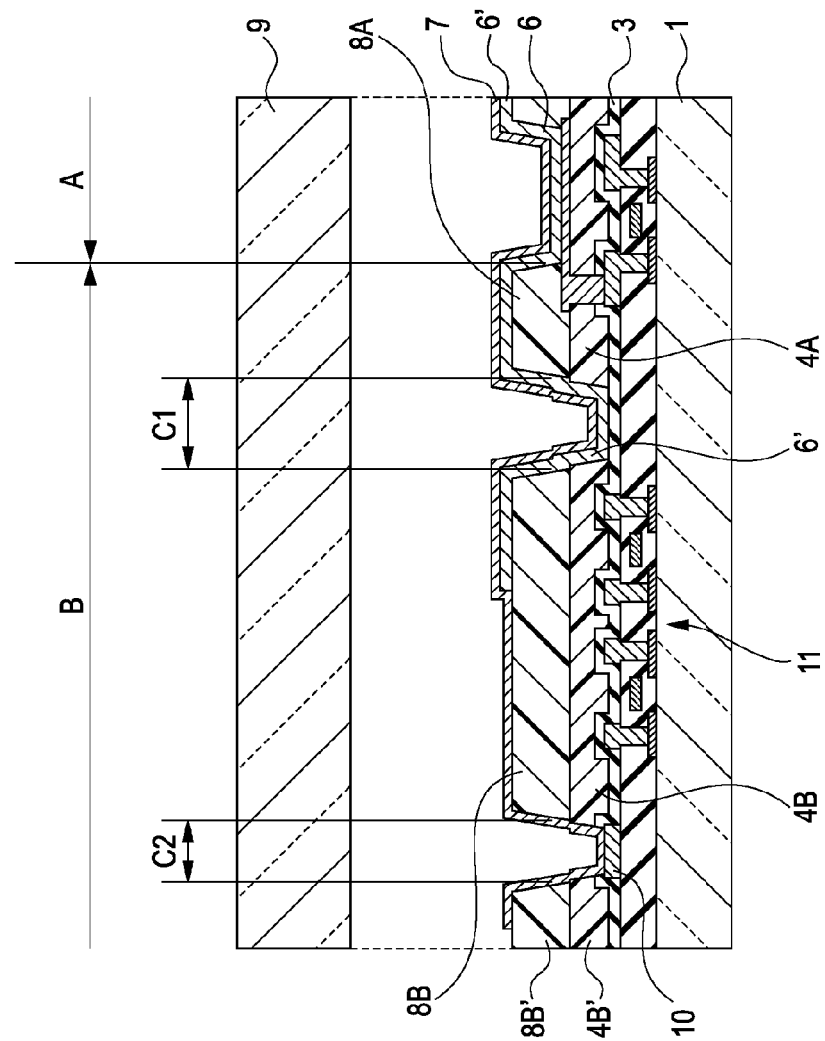
FIG. 3 is a sectional view schematically showing an example of an organic light-emitting device according to another embodiment of the present invention.

In contrast, in another embodiment shown in FIG. 3, besides the dividing region C1, a dividing region C2 is provided at a position opposite to the emission region A with respect to the dividing region C1. The planarization film 4B and the element separation film 8B in the peripheral region B are divided into planarization film 4B and element separation film 8B which cover the drive circuit 11 and other planarization film 4B' and element separation film 8B'. Further, the electrode wiring 10 is provided in the dividing region C2, and the electrode wiring 10 is electrically connected to the second electrode 7 through a contact hole formed in an inorganic insulating film 3. In this configuration, the electrode wiring 10 can be formed at the same time as the step of forming the TFT 2 and the drive circuit 11.

Figure 4:
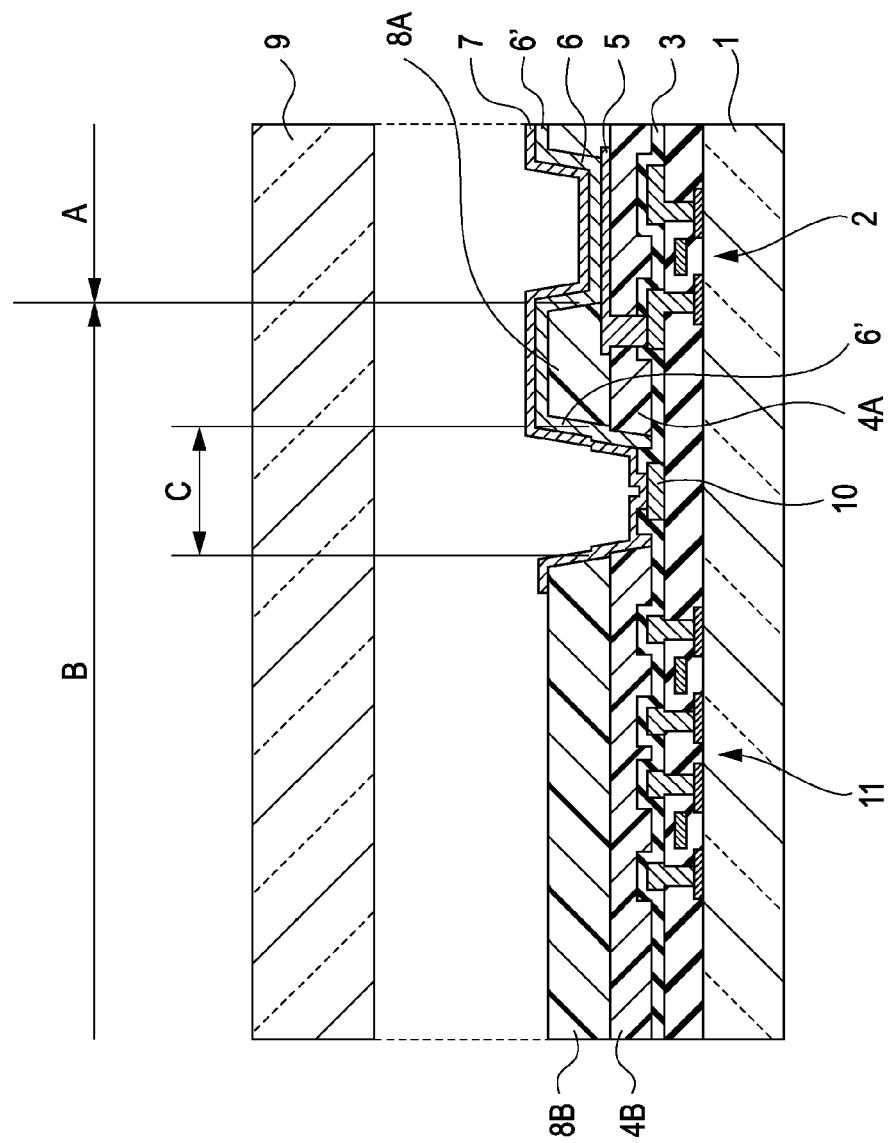
FIG. 4 is a sectional view schematically showing an example of an organic light-emitting device according to a further embodiment of the present invention.

In another embodiment shown in FIG. 4, the electrode wiring 10 is provided in a dividing region C, and the second electrode 7 is electrically connected to the electrode wiring 10 in the dividing region C. In this case, the electrode wiring 10 is provided near the emission region A where pixels are formed, and thus reduction of a potential to be supplied to the second electrode 7 in each pixel can be suppressed. In this configuration, also, the charge transport layer 6' is formed to extent to the outside of the emission region A so as to cover the side surface of a peripheral portion of the planarization film 4A, which is disposed in the peripheral region B. Therefore, this embodiment has the advantage of the present invention.

Figure 5:
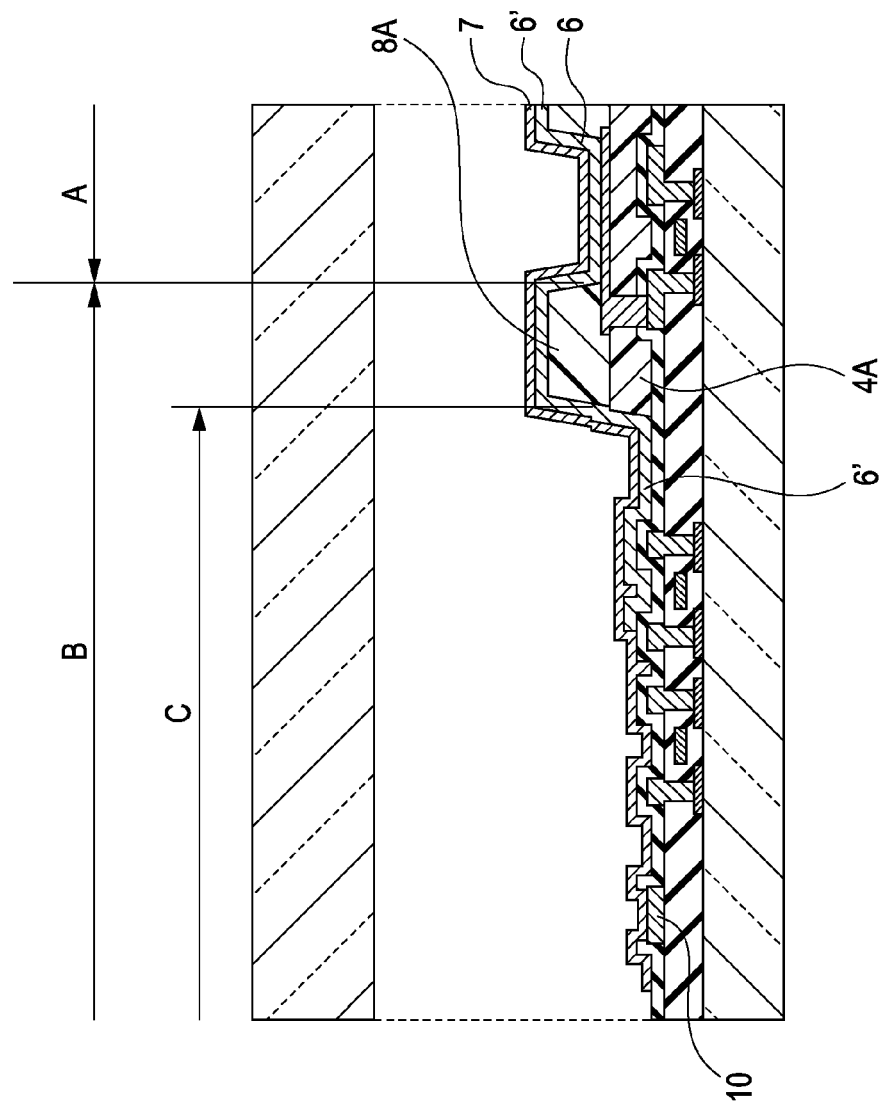
FIG. 5 is a sectional view schematically showing an example of an organic light-emitting device according to a still further embodiment of the present invention.

A further embodiment shown in FIG. 5 has a configuration in which the planarization film 4B and the element separation film 8B are not formed in the peripheral region B. In this configuration, the amount of moisture and gases remaining in the light-emitting device can be decreased. Although, in the configuration shown in FIG. 5, the electrode wiring 10 is disposed outside of the driving circuit 11 in the light-emitting device, the electrode wiring 10 may be disposed between the driving circuit 11 and the emission region A. In this case, in order to electrically connect the second electrode 7 and the electrode wiring 10, the charge transport layer 6' is formed so as not to be disposed on the electrode wiring 10.

Although, in the configurations of the above-described embodiments, the sealing glass 9 is used as the sealing layer, the sealing layer is not particularly limited as long as it can prevent entering of atmospheric moisture and gases into the light-emitting device. In the configuration of the embodiment shown in FIG. 3, instead of the sealing glass 9, an inorganic sealing film composed of an inorganic material, for example, silicon nitride, silicon oxide, or the like, may be formed as the sealing layer on the second electrode 7, and a polarization plate may be bonded through an adhesive layer. In this configuration, also, the charge transport layer 6' is formed to extent to the outside of the emission region A so as to cover the side surface of a peripheral portion of the planarization film 4A, which is disposed in the peripheral region B. Therefore, this embodiment has the advantage of the present invention.

In the embodiment shown in FIG. 1, moisture and gases remaining in the planarization film 4B and the element separation film 8B are adsorbed by the charge transport layer 6' provided in contact with the planarization film 4B and the element separation film 8B. For example, when the charge transport layer 6' contains Li, moisture and gases remaining in the planarization film 4B and the element separation film 8B are adsorbed by chemical bonding. However, chemical bonding between the adsorbed moisture and gases and Li may be broken and moisture and gases may diffuse into an organic EL element in each pixel within the emission region A through the charge transport layer 6' or the interface between the charge transport layer 6' and the second electrode 7.

Figure 6:
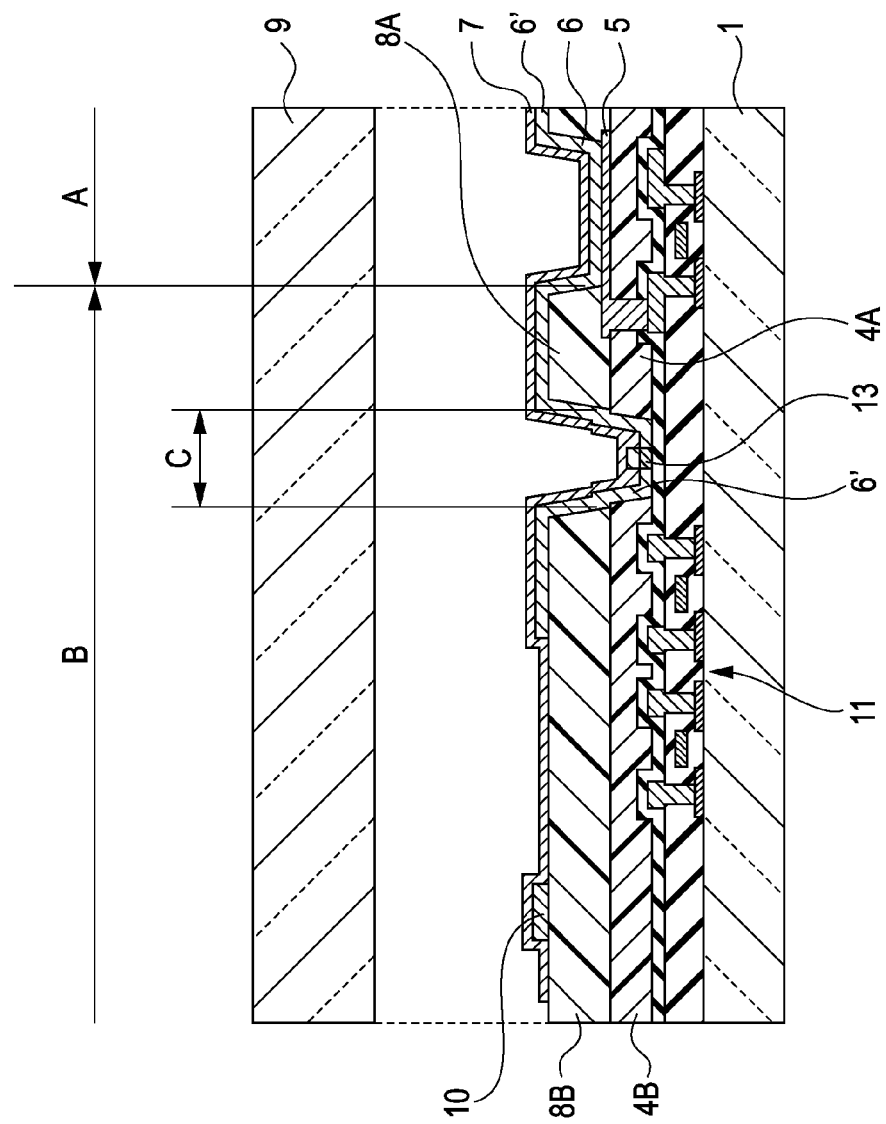
FIG. 6 is a sectional view schematically showing an example of an organic light-emitting device according to a further embodiment of the present invention.

In an embodiment shown in FIG. 6, in order to resolve this problem, a structure 13 is formed along a dividing region C in the dividing region C. The charge transport layer 6' is divided by the structure 13 and becomes discontinued, and the structure 13 is in contact with the second electrode 7. In addition, the structure can be formed using an inorganic material which little adsorbs moisture and gases.

In this configuration, it is possible to prevent direct diffusion of moisture and gases to an organic EL element from the planarization film 4B and the element separation film 8B in the peripheral region B through the charge transport layer 6', thereby achieving the effect of further cutting off moisture and gases.

The shape of the structure 13 is not limited as long as the condition of contact between the structure 13 and the second electrode 7 is satisfied in the process of forming the charge transport layer 6' and the second electrode 7. The taper angle of the side wall of the structure 13 is 45 degrees (angle) or more, particularly over 80 degrees (angle).

For example, when the layer constituting the charge transport layer 6' is formed by an evaporation process with high linearity, an organic material which constitutes the charge transport layer 6' little moves toward the side wall of the structure 13 disposed in the dividing region C, and thus the charge transport layer 6' does not cover the whole side wall of the structure 13. Subsequently, when the second electrode 7 is formed by sputtering, a material of the second electrode 7 moves toward the side wall of the structure, and thus the second electrode 7 is formed over the whole side wall of the structure 13, continuously forming the second electrode 7 on the side wall of the structure 13. Therefore, the charge transport layer 6' is divided by the structure 13 in the dividing region C and becomes discontinued.

When the structure 13 is formed using a conductive material, electric connection can be made between the structure 13 and the second electrode 7, and the structure 13 can be used as potential wiring for the second electrode 7. The potential wiring is provided for compensating a potential corresponding to a voltage drop produced when a potential is supplied to a pixel through the electrode wiring 10. When the structure 13 is used as the potential wiring, the structure 13 is preferably made of a conductive material and more preferably a conductive material with low resistance. For example, a single layer film composed of Al, Mo, Ag, Cu, or a compound thereof, or a laminated film containing these materials can be used. Also, the same material as that for forming each layer of the TFT 2 and the first electrode 5 can be used.

The structure 13 can be formed along the dividing region C in the dividing region C, but the structure 13 may be provided in the emission region A or the peripheral region B so that the charge transport layer 6' is discontinued in the horizontal direction of the drawing.

FIG. 6 illustrates one structure 13, but two structures may be arranged in parallel along the dividing region under conditions satisfying the above-described taper angle. Although, in the configuration shown in FIG. 6, the charge transport layer 6' is divided by the structure 13, the charge transport layer 6' may be discontinued by forming the inorganic insulating film 3 so that the inorganic insulating film 3 is not formed in a portion where the dividing region C to be formed.

EXAMPLE 1

This example is described with reference to FIGS. 2 and 3.

The TFT 2 was formed in the emission region A of the substrate 1 having the emission region A and the peripheral region B, and the drive circuit 11 for controlling drive of the TFT 2 was formed on the peripheral region B. At this time, the electrode wiring 10 was formed on the peripheral region B at the same time as the formation of drain wiring of the TFT 2. Further, the inorganic insulating film 3 was formed on the TFT 2 and the drive circuit 11 so as not to cover the electrode wiring 10. Then, in order to planarize irregularity produced by forming the TFT 2 and the drive circuit 11, the planarization film 4A was formed in the emission region A, and the planarization film 4B was formed in the peripheral region B so as to be separated from the planarization film 4A by the dividing region C and to surround the emission region A. The planarization film 4A and the planarization film 4B were made of acrylic resin. In addition, the electrode wiring 10 was not covered with the planarization film 4B.

Then, a contact hole was formed in the planarization film 4A in order to make electric contact between the first electrode 5 and the TFT 2, and the first electrode 5 was formed on the planarization film 4A. Then, the acrylic element separation film 8A was formed around the first electrode 5 on the planarization film 4A to define pixels. At the same time, the acrylic element separation film 8B was formed on the planarization film 4B so that the planarization film 4B and the element separation film 8B were separated from the planarization film 4A and the element separation film 8A by the dividing region C so as to surround the emission region A.

Although, in this example, the planarization film 4B and the element separation film 8B were formed to surround the emission region A, the planarization film 4B and the element separation film 8B need not surround the emission region A as long as they are provided to cover at least the drive circuit 11. Further, any one of the planarization film 4B and the element separation film 8B may be omitted or both films may be omitted.

As a material of the first electrode 5, tungsten was used. Further, in order to increase emission efficiency, a reflecting layer for reflecting light emitted in the direction to the substrate 1 so that the light is taken from the sealing glass 9 side, and a hole injection layer may be laminated on the first electrode 5. As a material for the reflecting layer, a material with high reflectivity, for example, an Ag alloy, an Al alloy, or the like, can be used. In this example, an Ag alloy was used. The hole injection layer is not particularly limited as long energy level connection to a hole transport layer is taken into consideration, and ITO, IZO, or the like can be used. In this example, ITO was used.

The thickness of the planarization film 4A and the planarization film 4B was 2 micrometers, and the thickness of the element separation film 8A and the element separation film 8B was 1.5 micrometers. In the element separation film 8A, the size of apertures for defining the pixels was 30 micrometers*45 micrometers, and the width between the pixels was 15 micrometers. In addition, the width of the dividing region C was 100 micrometers, and the electrode wiring 10 was formed at a distance of 350 micrometers from the dividing region C.

In a pixel, FLO3, DpyFL+sDTAB2, DFPH1, and DFPH1+Cs2CO3 were deposited by evaporation to form organic compound layers 6 including a hole transport layer, a light emitting layer, an electron transport layer, and an electron injection layer. Further, charge transport layers 6' including three layers, i.e., a hole transport layer (FLO3), an electron transport layer (DFPH1), and an electron injection layer (DFPH1+Cs2CO3), were formed to cross the dividing region C and extend from the first electrode 5 of each pixel to a portion of the top of the element separation film 8. The charge transport layers 6' covered 150 micrometers of the top of the element separation film 8 in the peripheral region B. The charge transport layers 6' were not disposed on the electrode wiring 10. Then, the second electrode 7 composed of IZO was deposited to a thickness of 0.04 micrometer on the organic compound layers 6 in each pixel, the charge transport layers 6' extending to outside of the emission region A, and the electrode wiring 10 to form an organic EL element in each pixel.

Further, the sealing glass 9 on which a desiccant (not shown) was disposed was bonded so that the sealing glass 9 faced the substrate 1 and sealed to form an organic EL light-emitting element shown in FIG. 3. After the substrate 1 was charged, the operations up to the formation of the second electrode 7 were performed in vacuum, and then the sealing work was performed in an atmosphere filled with nitrogen and controlled to a dew point of −75 degrees (Celsius) or less.

The organic light-emitting device of this example was stored in an environmental chamber controlled to a temperature of 80 degrees (Celsius) and a humidity of 25% or less. Emission display was performed at an interval of predetermined time, and the emission state of each pixel in the emission region A was observed with a microscope at a magnification of 500 times. After 3000 hours elapsed, deterioration was confirmed, in which the pixel emission area decreased at the four corners of the emission region A. The deterioration occurred in 6 pixels or less from the periphery of the emission region A. In the other portions of the emission region, visible deterioration of emission was not observed, and quality of a displayed image was maintained at a level equivalent to that before temperature loading.

In this example, the charge transport layers 6' include the three layers, i.e., the hole transport layer, the electron transport layer, and the electron injection layer. However, the effect of the present invention is exhibited as long as the charge transport layers 6' include at least the electron injection layer containing Cs as an alkali metal.

EXAMPLE 2

This example is described with reference to FIG. 6.

In this example, the same organic light-emitting device as Example 1 was produced except that the electrode wiring is formed on the planarization film 4B and the element separation film 8B which are formed in the peripheral region B, and the structure 13 is formed in the dividing region C when the first electrode 5 is formed. The electrode wiring 10 was formed after the element separation film 8B was formed and before the charge transport layers 6' including the three layers, i.e., the hole transport layer, the electron transport layer, and the electron injection layer, were formed by evaporation. The structure 13 was formed along the dividing region C in the dividing region C at the same time as the formation of the first electrode 5. The structure 13 had a width of 30 micrometers and a height of 0.25 micrometer. The total thickness of the charge transport layers 6' was 0.11 micrometer, and each of the layers of the charge transport layers 6' was formed by an evaporation process causing little deviation. Therefore, the charge transport layers 6' were divided by the structure 13 within the dividing region C. Further, the second electrode 7 was deposited on the organic compound layers 6 and the charge transport layers 6' by a sputtering process. Since the sputtering process caused wraparound, the second electrode 7 was formed on the side surfaces of the structure 13, and thus the second electrode 7 was not divided by the structure 13 and not discontinuous.

The organic light-emitting device of this example was stored in an environmental chamber controlled to a temperature of 80 degrees (Celsius) and a humidity of 25% or less. Emission display was performed at an interval of predetermined time, and the emission state of each pixel in the emission region A was observed with a microscope at a magnification of 500 times. After 3000 hours elapsed, deterioration was confirmed, in which the pixel emission area decreased at the four corners of the emission region A. The deterioration occurred in 2 pixels or less from the periphery of the emission region A. In the other portions of the emission region, visible deterioration of emission was not observed, and quality of a displayed image was maintained at a level equivalent to that before temperature loading.

COMPARATIVE EXAMPLE 1

Figure 7:
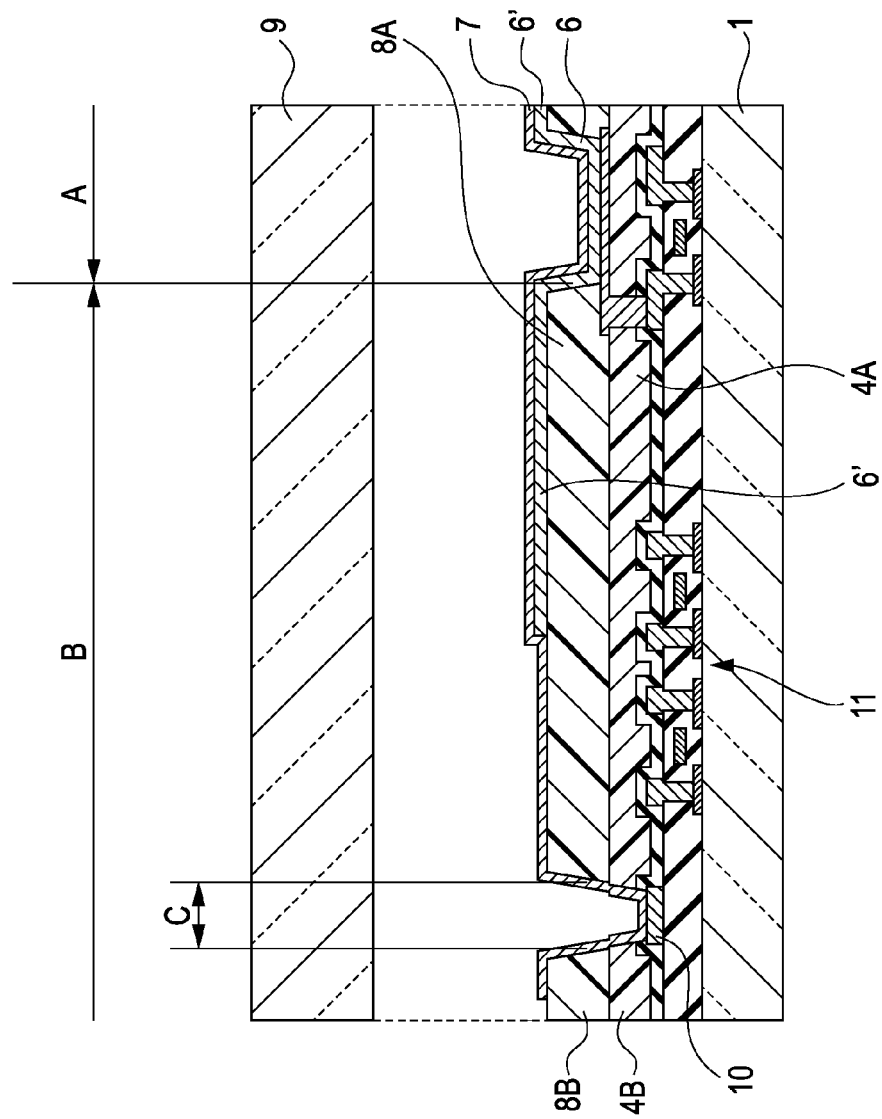
FIG. 7 is a sectional view schematically showing a comparative example of an organic light-emitting device according to an embodiment of the present invention.

This example is described with reference to FIG. 7.

In this comparative example, the same organic light-emitting device as Example 1 was produced except that the dividing region C1 (FIG. 3) was not formed, only the dividing region C2 was formed, and the charge transport layers 6' did not cover the side surface of a peripheral portion of the planarization film 4A which is disposed in the peripheral region B, the planarization film 4A being formed in the emission region A.

The organic light-emitting device of this comparative example was stored in an environmental chamber controlled to a temperature of 80 degrees (Celsius) and a humidity of 25% or less. Emission display was performed at an interval of predetermined time, and the emission state of each pixel in the emission region A was observed with a microscope at a magnification of 500 times. After 800 hours elapsed, deterioration was confirmed, in which the pixel emission area decreased at the four corners of the emission region A. The deterioration occurred in 6 pixels or less from the periphery of the emission region A. As a result of further evaluation, after 3000 hours elapsed, pixels incapable of light emission were observed in 4 pixels or less from the emission region A at the four corners of the emission region A, and in a portion, deterioration in which the pixel emission area decreased occurred in 35 pixels from the periphery of the emission region A. In the other portions of the emission region, visible deterioration of emission was not observed, but deterioration in emission was observed at the corners of the emission region A when a displayed image was visually observed.

In the organic light-emitting device of the present invention, moisture and gases remaining in the planarization film and the element separation film which are disposed in the emission region are adsorbed by the charge transport layer containing any one of alkali metals and alkaline earth metals, thereby decreasing the amounts of moisture and gases diffusing into an organic EL element in each pixel. Further, the charge transport layer provided in each pixel is extended to cover the side surface of a peripheral portion of the planarization film, which is disposed in the peripheral region, avoiding the planarization film and the element separation film in the emission region from being exposed to the sealing space. Therefore, even if moisture and gases are present in the sealing space, entering of the moisture and gases into the planarization film and the element separation film can be decreased. In addition, the planarization film and the element separation film are covered with the charge transport layer, moisture and gases remaining in the planarization film and the element separation film can be efficiently adsorbed by the charge transport layer. As a result, an organic light-emitting device with excellent long-term reliability can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-150489, filed Jun. 9, 2008, which is hereby incorporated by reference herein in its entirety.

EXPLANATION OF REFERENCE

1 Substrate
2 Thin film transistor (TFT)
3 Inorganic insulating film
4A, 4B, 4B' Planarization film
5 First electrode
6 Organic compound layer
6' Charge transport layer
7 Second electrode
8A, 8B, 8B' Element separation film
9 Sealing glass
10 Electrode wiring
11 Drive circuit
12 Power supply and signal supply pad
13 Structure
A Emission region
B Peripheral region
C, C1, C2 Dividing region

The invention claimed is:

1. An organic light-emitting device comprising:
   a substrate having an emission region in which pixels are arranged and a peripheral region which surrounds the emission region,
   thin film transistors arranged in the emission region of the substrate,
   a planarization film which is composed of a resin and which planarizes the thin film transistors,
   an element separation film which defines pixels formed on the planarization film, and
   an organic EL element including at least a first electrode, a light-emitting layer, a charge transport layer containing any one of alkali metals and alkaline-earth metals, and a second electrode, which are disposed on the planarization film within each of the pixels,
   wherein the charge transport layer extends to outside of the emission region so as to cover the side surface of a peripheral portion of the planarization film, which is disposed in the peripheral region, the planarization film being formed in the emission region,
   wherein the planarization film is divided by a dividing region provided in the peripheral region, and
   wherein the charge transport layer extends to the peripheral region so as to cover the dividing region of the substrate and a side surface of the planarization film on the drive circuit, the side surface being disposed in the dividing region.

2. The organic light-emitting device according to claim 1, wherein the charge transport layer is in contact with the element separation film and the planarization film.

3. The organic light-emitting device according to claim 1, wherein a drive circuit is disposed in the peripheral region of the substrate in order to control drive of the thin film transistors, the planarization film is formed on the drive circuit.

4. The organic light-emitting device according to claim 1, wherein the charge transport layer is discontinued in the dividing region by a structure formed along the dividing region within the dividing region of the substrate.

5. The organic light-emitting device according to claim 4, wherein the structure is composed of a conductive material and is electrically connected to the second electrode.

6. A display apparatus comprising the organic light-emitting device according to claim 1.

* * * * *